United States Patent
Yang et al.

(10) Patent No.: US 7,436,030 B2
(45) Date of Patent: Oct. 14, 2008

(54) STRAINED MOSFETS ON SEPARATED SILICON LAYERS

(75) Inventors: Haining Yang, Wappingers Falls, NY (US); Thomas W. Dyer, Pleasant Valley, NY (US); Wai-Kin Li, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 113 days.

(21) Appl. No.: 11/463,640

(22) Filed: Aug. 10, 2006

(65) Prior Publication Data

US 2008/0036012 A1    Feb. 14, 2008

(51) Int. Cl.
    *H01L 29/94*     (2006.01)
    *H01L 21/336*     (2006.01)

(52) U.S. Cl. .............. 257/374; 257/244; 257/466; 257/E29.02; 257/E21.55; 257/E21.551; 257/E21.553; 257/E21.554; 438/294; 438/297; 438/682

(58) Field of Classification Search .............. 257/374, 257/351, E29.02, E21.55, E21.551, E21.553, 257/E21.554
See application file for complete search history.

(56) References Cited

U.S. PATENT DOCUMENTS 7,214,963 B2 *   5/2007   Choi et al. .................. 257/67

2003/0127697 A1 *   7/2003   Ohta et al. .................. 257/390

OTHER PUBLICATIONS

Singer, "Dual Liner Stresses NMOS and PMOS," Reed Business Information, 2006, pp. 1-2.*
Tilke et al., "Using an STI gap-fill technology with a high-aspect-ratio process for 45-nm CMOS and beyond," Micro Magazine, May 2006, pp. 1-12.*

* cited by examiner

*Primary Examiner*—Long K Tran
(74) *Attorney, Agent, or Firm*—H. Daniel Schnurmann; Hoffman Warnick LLC

(57) ABSTRACT

A method of fabricating and a structure of an IC incorporating strained MOSFETs on separated silicon layers are disclosed. N-channel field effect transistors (nFET) and P-channel FETs (pFET) are formed on the separated silicon layers, respectively. Shallow trench insulation (STI) regions adjacent to the nFETs and pFETs thus can be formed to induce different stress to the channel regions of the respective nFETs and pFETs. As a consequence, performance of both the nFETs and the pFETs can be improved by the STI stress. In addition, the area of the IC can also be reduced as the two silicon layers are positioned vertically relative to one another.

12 Claims, 7 Drawing Sheets

STRAINED MOSFETS ON SEPARATED SILICON LAYERS

FIELD OF THE INVENTION

The invention relates generally to an integrated circuit (IC), and more particularly, to a method of fabricating and a structure of an IC incorporating strained MOSFETs on separated silicon layers.

BACKGROUND ART

As semiconductor technology sizes are reduced, shallow trench isolation (STI) has become a preferable choice for electrical isolation. As current research shows, STI stress has significant impacts on complementary metal oxide semiconductor (CMOS) device performance. For example, STI stress may cause strain in channel regions of adjacent devices (referred to as strained devices) such that electrical characteristics of the devices will be modified. As is known in the art, STI stress that enhances one type of device, e.g., N-channel field effect transistor (nFET), would degrade the other type of device, e.g., P-channel field effect transistor (pFET). For example, tensile STI stress will increase on-current ($I_{on}$) of an nFET by increasing electron mobility such that performance of a pFET will be enhanced. However, tensile STI stress will have the opposite effect on a nearby pFET by reducing hole mobility and hence decreasing $I_{on}$ of the pFET. In a conventional CMOS circuit, e.g., circuit 10 of FIG. 1, nFET 12 and pFET 14 are separated by STI 16 on the same silicon layer (substrate) 18. As such, effects of STI 16 stress on conventional CMOS circuit 10 are always mixed, i.e., enhancing one type of device, e.g., nFET 12, while degrading the other type of device, e.g., pFET 14, regardless of the type of stress.

In addition, different types of liner stress are known to have different effects on the FET performance. One approach to this problem proposes a dual stress liner to improve both nFET and pFET performance. However, formation of dual stress liner requires multiple deposition and etching of liner films from the FETs in the presence of a silicide, which may seriously affect the silicide sheet resistance value.

In view of the foregoing, there is a need in the art for a solution to solve the above identified problems and take the full advantages of strained MOSFETs.

SUMMARY OF THE INVENTION

A method of fabricating and a structure of an IC incorporating strained MOSFETs on separated silicon layers are disclosed. N-channel field effect transistors (nFET) and P-channel FETs (pFET) are formed on the separated silicon layers, respectively. Shallow trench insulation (STI) regions adjacent to the nFETs and pFETs thus can be formed to induce different stress to the channel regions of the respective nFETs and pFETs. As a consequence, performance of both the nFETs and the pFETs can be improved by the STI stress. In addition, the area of the IC can also be reduced as the two silicon layers are positioned vertically relative to one another.

A first aspect of the present invention includes an integrated circuit (IC) comprising: two silicon layers separated by a dielectric layer, one of the two silicon layers located above the other one; an N-channel field effect transistor (nFET) formed on one of the two silicon layers, and a P-channel field effect transistor (pFET) formed on the other one of the two silicon layers; and a first shallow trench isolation (STI) adjacent to the nFET, and a second STI adjacent to the pFET, wherein the first STI and the second STI induce different stress in a channel region of the nFET and a channel region of the pFET, respectively.

A second aspect of the present invention includes a method for fabricating an integrated circuit, the method comprising: forming a first field effect transistor (FET) and a first shallow trench isolation (STI) on a first silicon layer, the first FET and the first STI adjacent to one another; siliciding the first FET; depositing a first dielectric layer over the first FET; forming a contact to the first FET through the first dielectric layer; depositing a second dielectric layer over the first dielectric layer; forming a second silicon layer over the second dielectric layer; forming a second FET and a second STI on the second silicon layer, the second FET and the second STI adjacent to one another; siliciding the second FET; depositing a third dielectric layer over the second FET; and forming a contact to the second FET and extending the contact to the first FET through the third dielectric layer.

A third aspect of the present invention includes an integrated circuit (IC) comprising: an N-channel field effect transistor (nFET) on a first silicon layer; a first shallow trench insulation (STI) adjacent to the nFET on the first silicon layer, the first STI inducing tensile stress on a channel region of the nFET; a P-channel FET (pFET) on a second silicon layer; and a second STI adjacent to the pFET on the second silicon layer, the second STI inducing compressive stress on a channel region of the pFET; wherein the first silicon layer and the second silicon layer are positioned differently vertically relative to one another.

The illustrative aspects of the present invention are designed to solve the problems herein described and other problems not discussed which are discoverable by a skilled artisan.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 8:
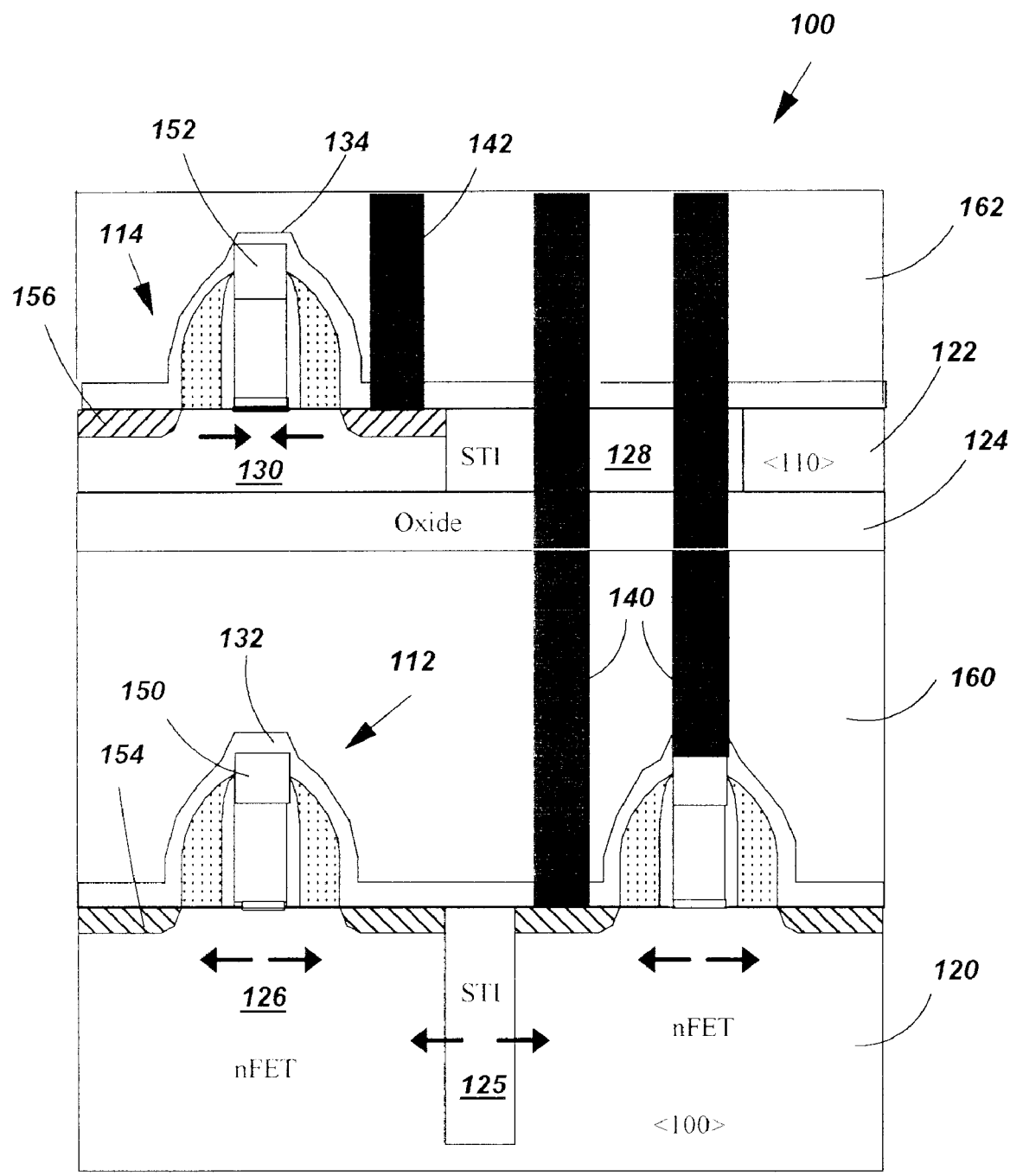

One embodiment of the invention includes, as shown in FIG. 8, an IC 100 having strained nFET 112 and strained pFET 114 devices on separated and stacked silicon layers 120, 122, respectively. Silicon layers 120 and 122 are positioned differently vertically relative to one another, and are separated and isolated by, among other things, a dielectric layer 124, e.g., silicon oxide layer 124, and an inter-layer dielectric layer (ILD) 160. In FIG. 8, silicon layer 122 (upper silicon layer) is shown as positioned above silicon layer 120 (lower silicon layer) for illustrative purposes, with the understanding that this specific embodiment does not limit the scope of the invention. For example, silicon layer 120, where nFETs 112 are located, may be positioned above silicon layer 122. According to one embodiment, silicon layers 120, 122 may have different crystalline orientations, e.g., <100> and <110>, respectively. While the two particular crystalline orientations, <100> and <110>, are illustrative, other crystalline orientations may also be used as long as they are different from one another. In addition, it should be appreciated that silicon layers 120, 122 may have the same crystalline orientation.

A shallow trench insulation (STI) region 125 is located in silicon layer 120 and adjacent to nFETs 112. According to one embodiment, STI 125 includes high tensile stress materials to induce tensile stress in channels regions (bodies) 126 of nFET 112. It should be appreciated that the scope of the invention is not limited by the specific type of STI materials of STI 125. For example, STI 125 may include compressive stress materials, if required.

A STI 128 is located in silicon layer 122 adjacent to pFET 114. According to one embodiment, STI 128 includes different stress characteristics than STI 125, e.g., STI 125 and STI 128 induce different stress in nFET 112 channel region 126 and pFET 114 channel region 130, respectively. For example, in the case that STI 125 includes high tensile stress fill materials, STI 128 may include high compressive stress materials to induce compressive stress in channel region (body) 130 of pFET 114. It should be appreciated that the scope of the invention is not limited by the specific type of STI characteristics or fill materials of STI 128. For example, STI 128 may include tensile stress materials.

Liner layers 132, 134 are positioned above and cover nFETs 112 and pFET 114, respectively. According to one embodiment, liner layers 132 and 134 include different stress characteristics, e.g., liner layers 132 and 134 induce different stress in nFET 112 channel region 126 and pFET 114 channel region 130, respectively. For example, liner layer 132 may be a tensile stress liner to induce tensile stress in nFET 112 channel region 126 to enhance electron mobility. Liner layer 134 may be a compressive stress liner layer to induce compressive stress in pFET 114 channel region 130. It is appreciated that liner layers 132, 134 may include any type of material, and all are included in the current invention. For example, liner layers 132, 134 may include silicon nitride ($Si_3N_4$), and may be referred to as nitride liner layers for illustrative purposes.

According to one embodiment, positions of STI 128 and devices, e.g., nFET 112, on the lower silicon layer, here 120, are designed such that contacts 140 to devices on the lower silicon layer extend through STI 128 to avoid electrical short to, i.e., be insulated from, silicon of upper silicon layer 122 and devices, e.g., pFET 114. It should be appreciated other methods of insulating devices on upper silicon layer 122 from contacts to devices on lower silicon layer 120 are also included in the invention.

According to one embodiment, silicide of nFET 112 and silicide of pFET 114 include different silicide stress, as will be described later.

Figure 1:
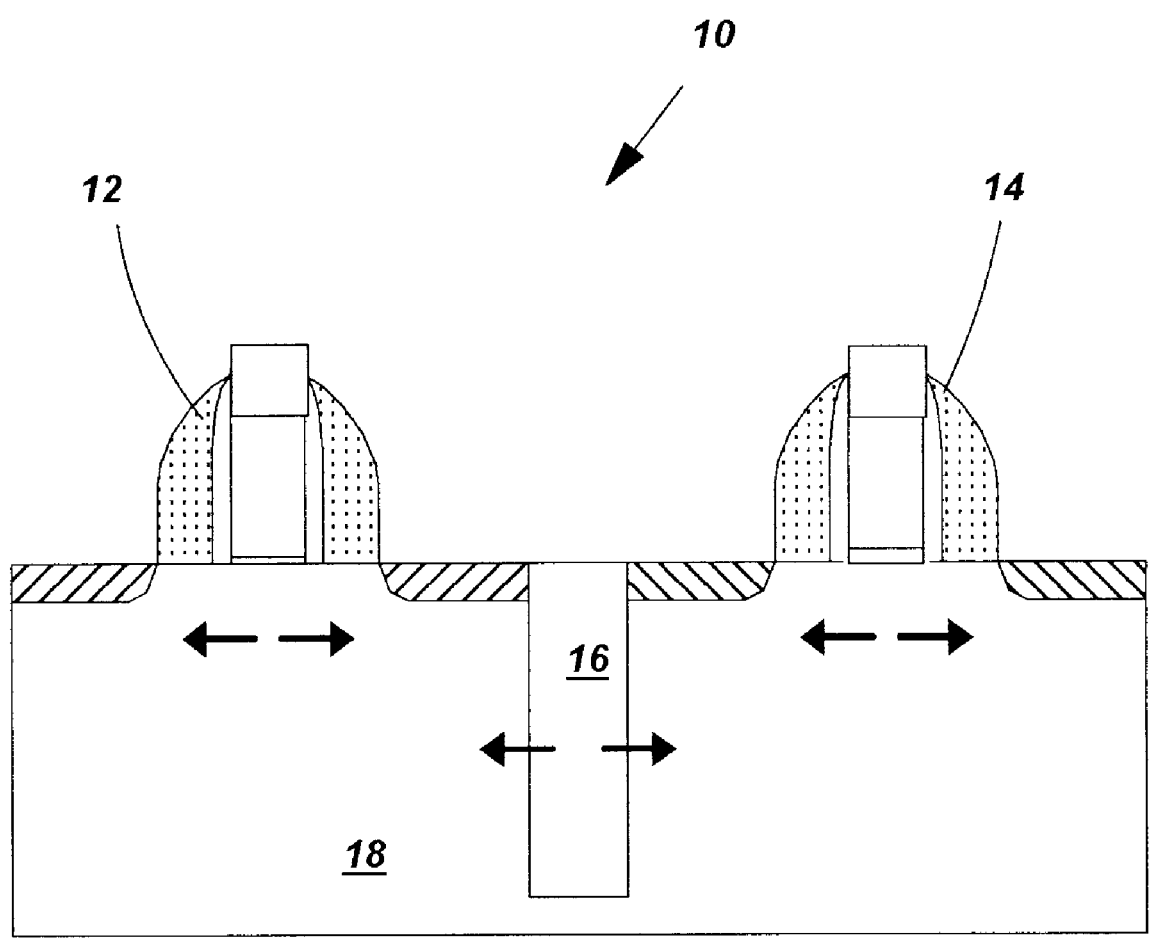
FIG. 1 shows a conventional complementary metal oxide semiconductor (CMOS) device with an STI.
Figure 2:
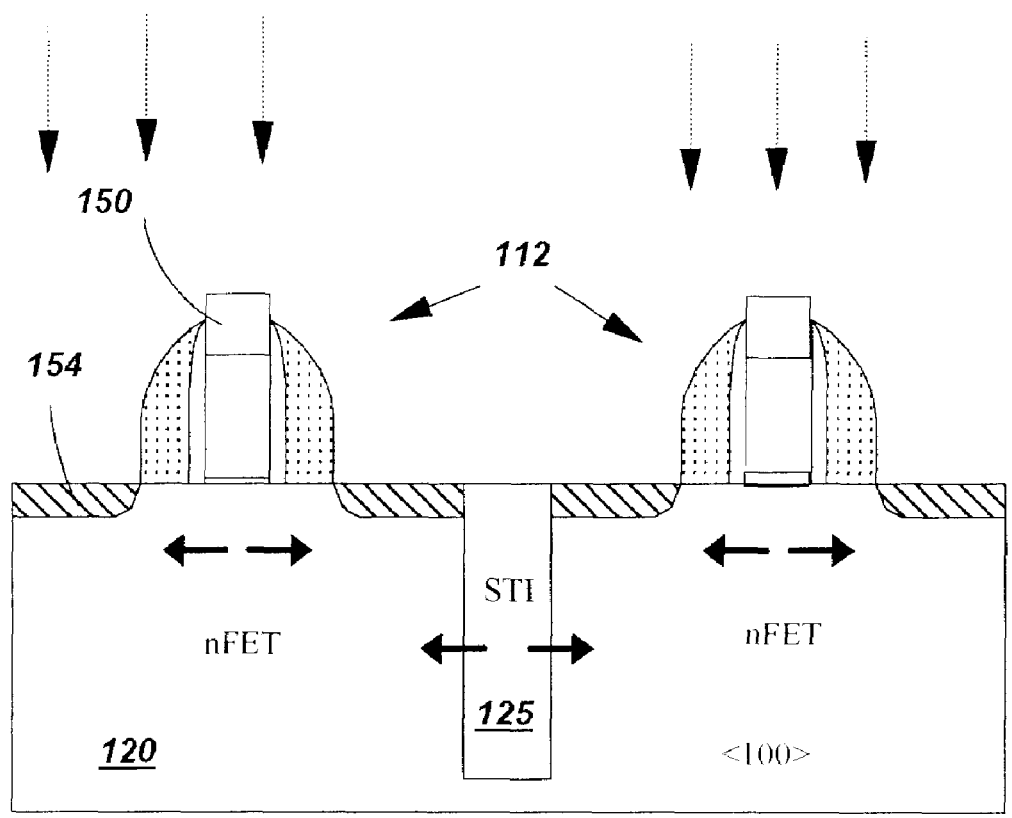
FIGS. 2-8 show one embodiment of a method of forming an integrated circuit including strained MOSFETs on separated silicon layers, with FIG. 8 showing one embodiment of the IC, according to the invention.

FIGS. 2-8 show a method of forming IC 100 of FIG. 8 according to one embodiment of the invention. Referring to FIG. 2, the process may begin with a first silicon (lower) layer 120 of crystalline orientation of <100>. NFETs 112 and STI 125 may then be formed on and within silicon layer 120, with STI 125 and nFET 112 adjacent to one another. It is appreciated that any now known or later developed methods may be used to form nFETs 112 and STI 125, and all are included in the invention. For example, STI 125 fill materials (STI fill) may include silicon oxide ($SiO_2$) deposited using high-density plasma (HDP) or thermal chemical vapor deposition (CVD) based on ozone ($O_3$)/tetraethylorthosilicate (TEOS, $Si(OC_2H_5)_4$). According to one embodiment, STI 125 fill includes a high tensile stress. Any methods may be used to control STI fill deposition process to achieve the stress characteristics, e.g., tensile stress, of STI 125. For example, the deposition temperature of STI materials may be controlled to achieve a desired STI stress characteristics. In the case that CVD is used for the deposition, when the deposition temperature is high enough, e.g., higher than approximately 900° C., or low enough, e.g., lower than approximately room temperature, STI 125 fill of $SiO_2$ may include compressive stress; while STI 125 fill of $SiO_2$ may include tensile stress if the deposition temperature is in-between the stated temperatures, e.g., 600° C.

Next, gates 150 and/or diffusion areas 154 of nFETs 112 are silicided using metals and under parameters (e.g., annealing temperature) specifically selected for the requirements of nFETs 112. Particularly, silicide stress of nFET 112 silicide may be controlled to enhance the performance, e.g., electron mobility, of nFETs 112. Any methods may be used to control the silicide stress of nFET 112, and all are included in the invention. For example, deposition parameters of the silicidation of nFET 112 may be controlled to tune the silicide stress. For another example, structure and composition of the silicide film of nFETs 112 can also be controlled to achieve a desired silicide stress.

Figure 3:
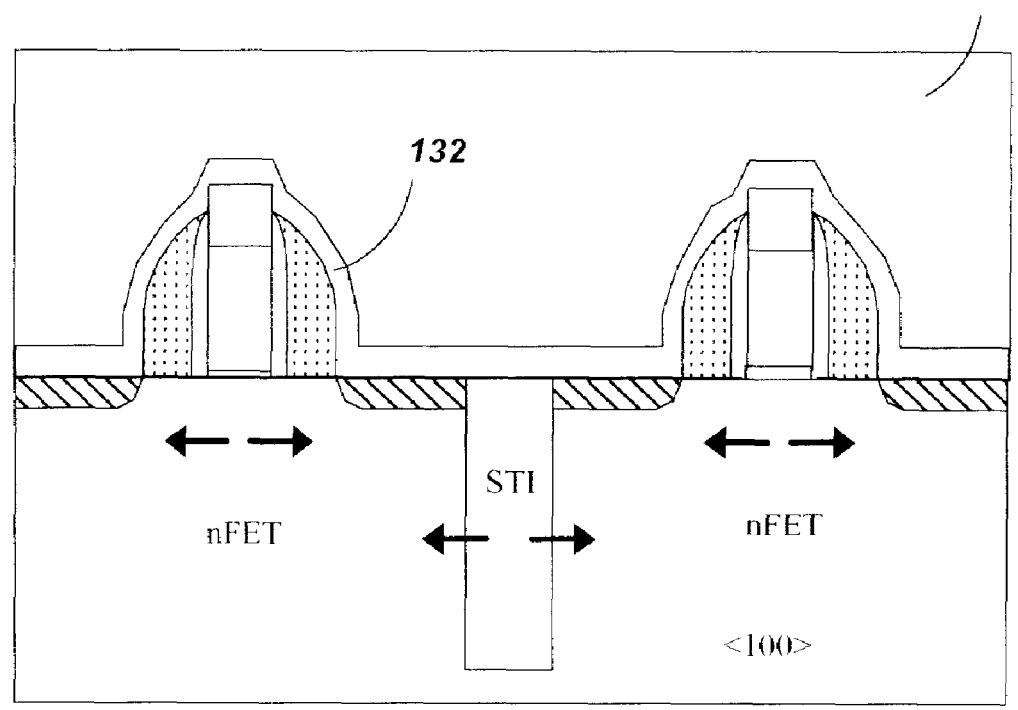

Turning to FIG. 3, tensile nitride liner (capping) layer 132 is deposited on and covers nFETs 112 using any now known or later developed methods. Following tensile nitride liner layer 132, inter-layer dielectric (ILD) layer 160, e.g., of silicon oxide, is deposited over tensile nitride liner layer 132. It should be appreciated that ILD layer 160 (and other ILDs of the invention) may include any material(s), e.g., silicon nitride ($Si_3N_4$), silicon oxide ($SiO_2$), fluorinated $SiO_2$ (FSG), hydrogenated silicon oxycarbide (SiCOH), and porous SiCOH.

Figure 4:
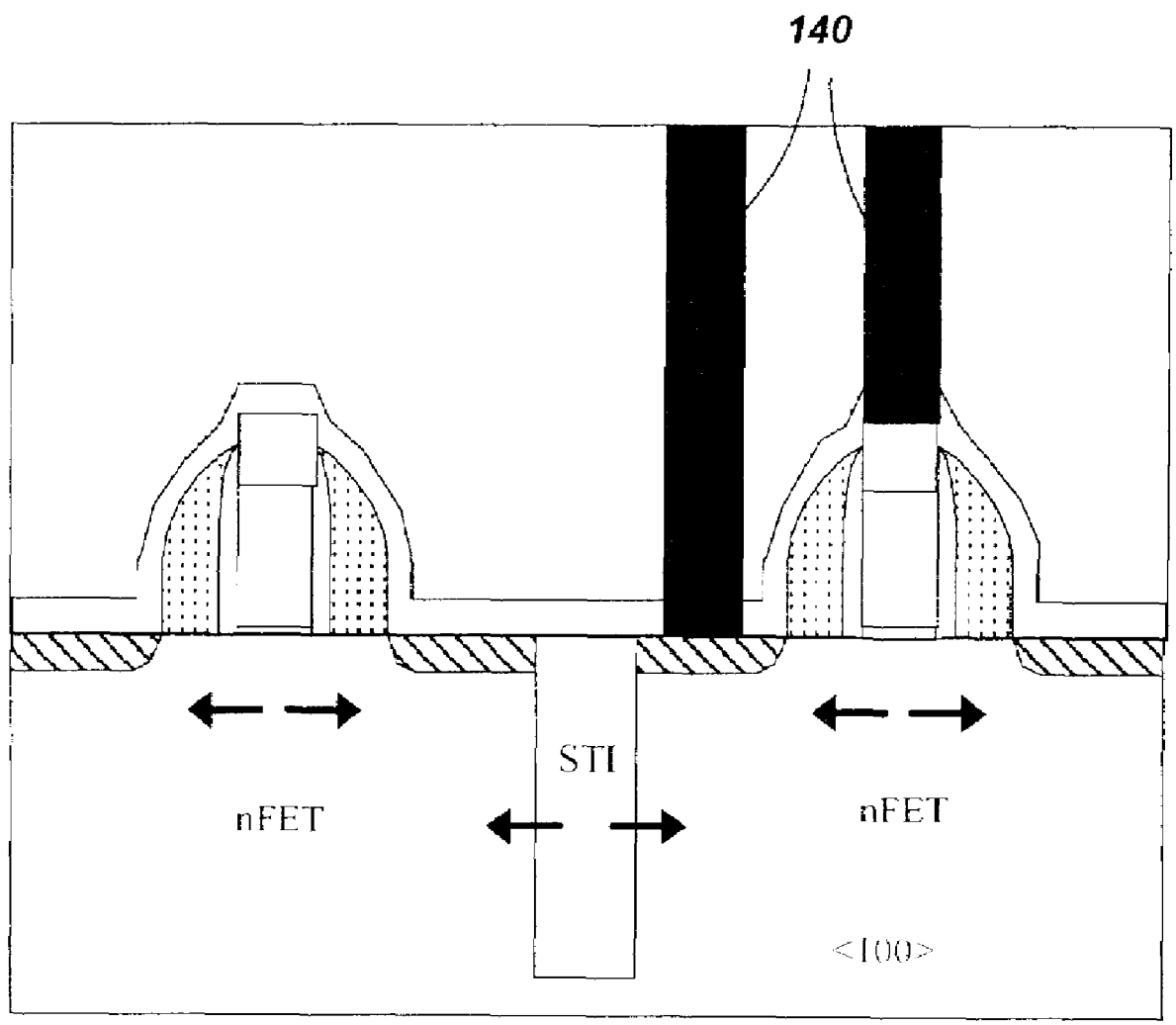

Turning to FIG. 4, contacts 140 are formed through ILD layer 160 and tensile nitride liner 132 to contact gate 150 and/or diffusion area 154 of nFET 112. Any methods may be used in forming contacts 140, and all are included in the invention.

Figure 5:
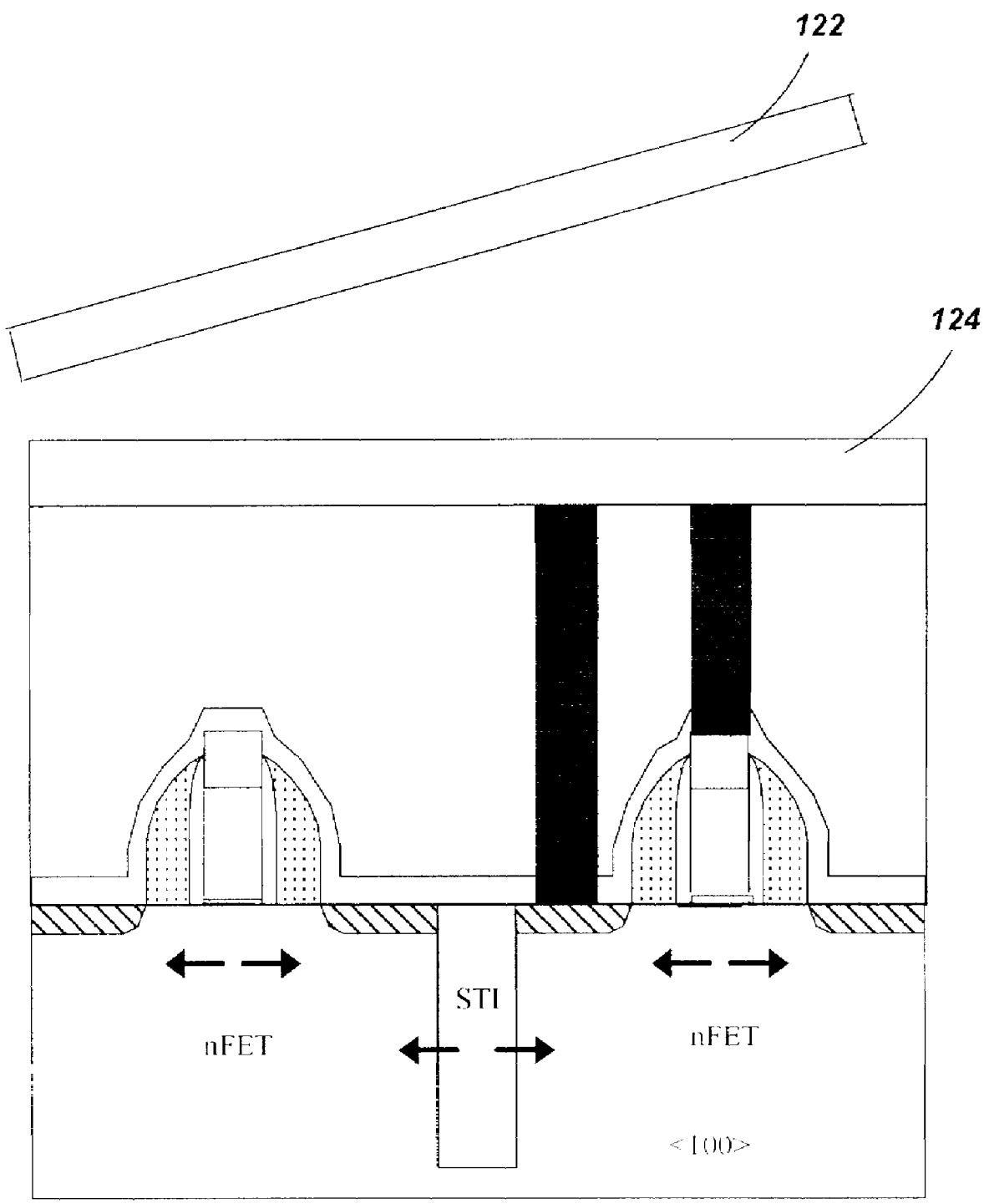

Turning to FIG. 5, another ILD layer 124, e.g., of silicon oxide, is formed over ILD layer 160, using any methods. Following ILD layer 124, second silicon layer (upper) 122 is formed over ILD layer 124, using any methods, e.g., bonding. According to one embodiment, second silicon layer 122 is of a different crystalline orientation than first silicon layer 120. For example, second silicon layer 122 is of crystalline orientation <110>.

Figure 6:
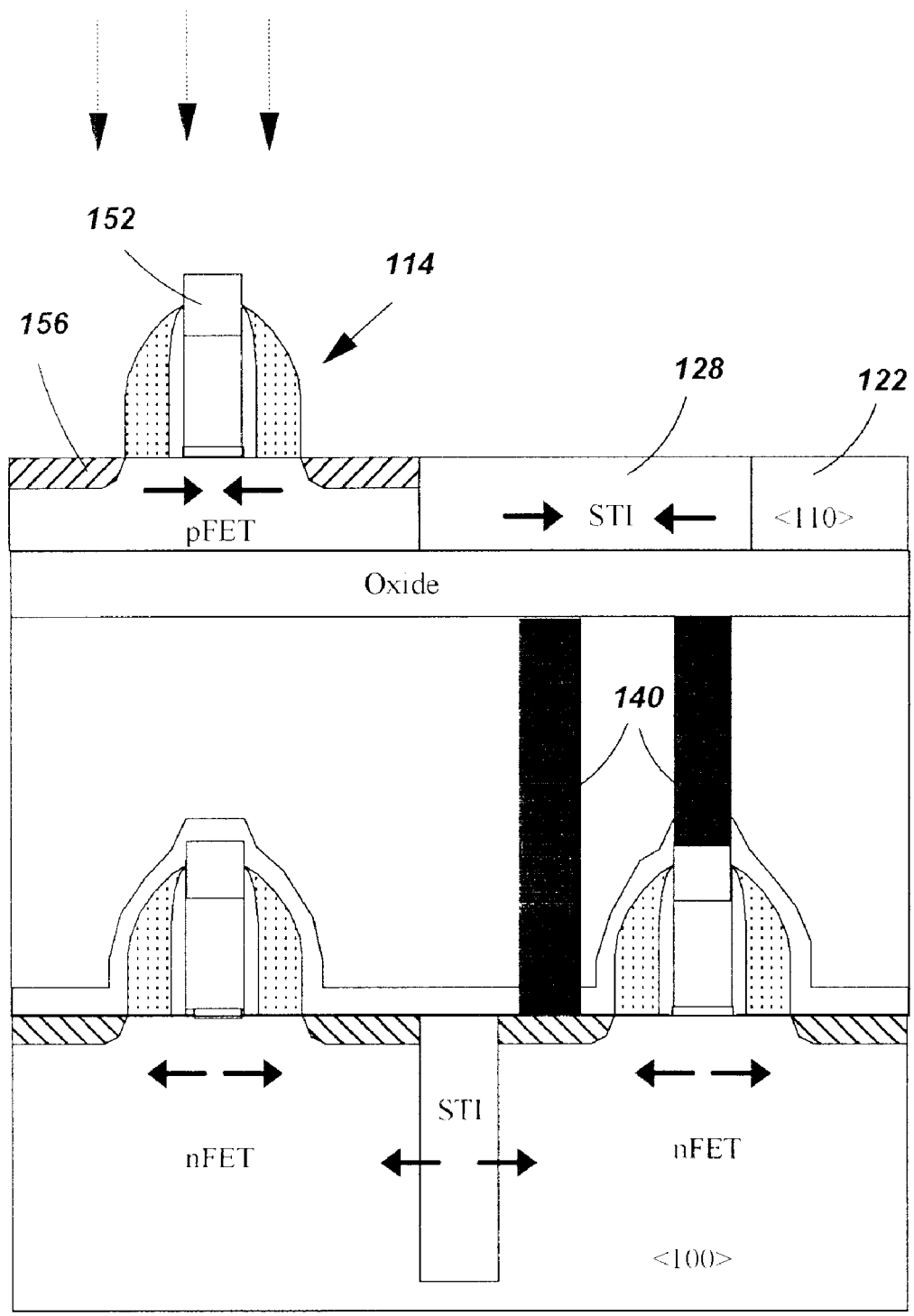

Turning to FIG. 6, pFET 114 and STI 128 are formed on/in second silicon layer 122. According to one embodiment, STI 128 is formed all through second silicon layer 122 until ILD layer 124. According to one embodiment, STI 128 is formed over contact 140 such that contacts 140 (to nFETs 112 on the first/lower silicon layer 120), if extended through second silicon layer 122, will extend through STI 128 such that contacts 140 will be insulated from the silicon of second silicon layer 122.

According to one embodiment, deposition of STI 128 fill material and deposition of STI 125 fill material is controlled such that STI 125 and STI 128 include different STI stress characteristics. For example, STI 128 includes high compressive stress to induce compressive stress in channel (body) region 130 (FIG. 8) of pFET 114. Other embodiments are all possible and are included in the invention.

Next, gate 152 and/or diffusion regions 156 of pFET 114 are silicided using metals, and under parameters, e.g., annealing temperature, specifically selected for the requirement of pFET 114. Particularly, silicide stress of pFET may be controlled to enhance specifically the performance, e.g., electron mobility, of pFET 114. As such, silicidation of nFET 112 and silicidation of pFET 114 may generate silicides that include different silicide stress.

Figure 7:
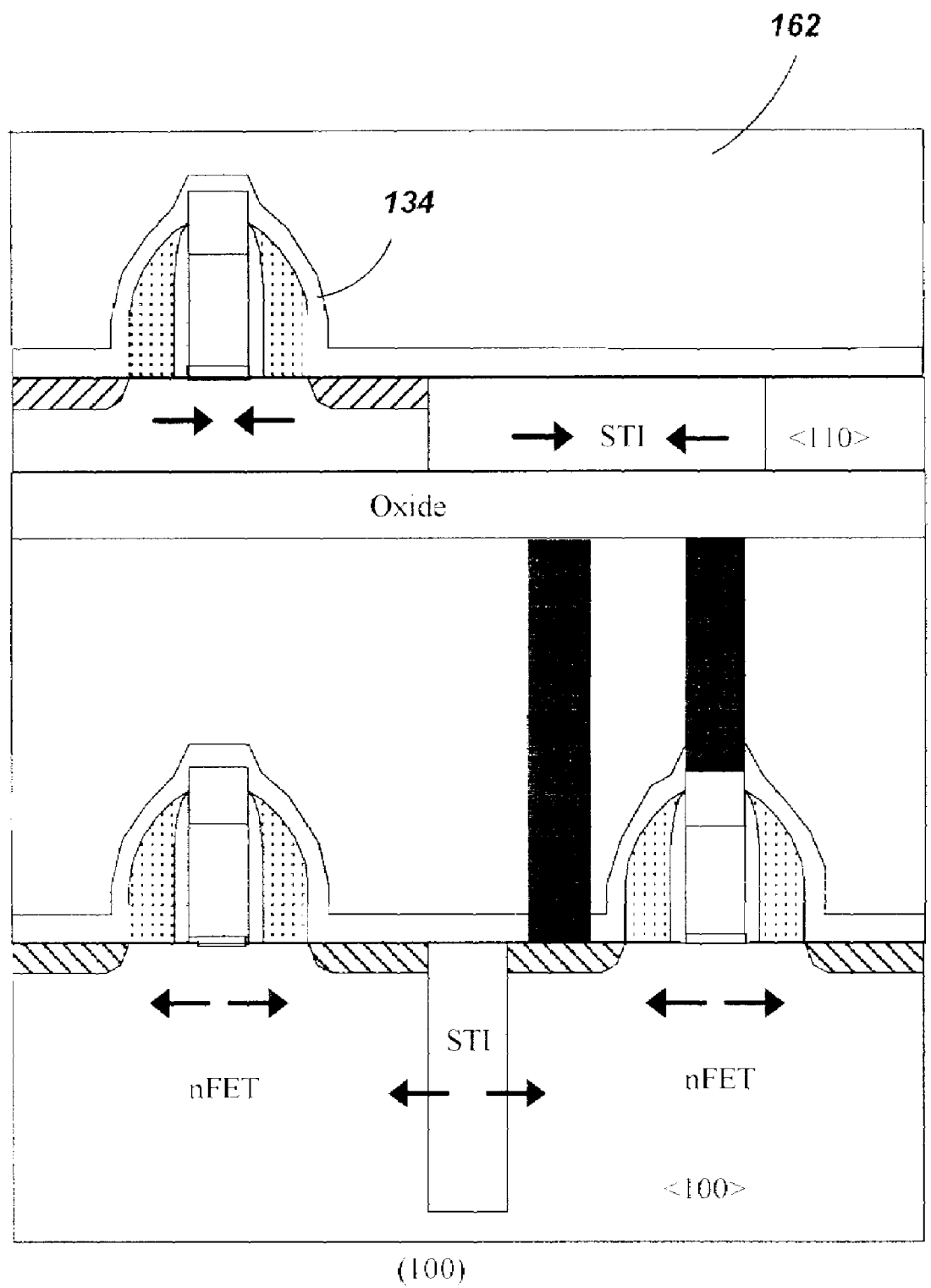

Turning to FIG. 7, compressive nitride liner layer 134 is formed to cover pFET 114 using any methods. As such, in the current invention, deposition of liner layer over nFET 112 (e.g., tensile nitride liner layer 132) and liner layer over pFET 114 (e.g., compressive nitride liner layer 134) can be controlled such that liner layer 132 and liner layer 134 include different stress characteristics, e.g., inducing tensile stress and compressive stress, respectively. Following compressive nitride liner layer 134, ILD layer 162 is deposited over layer 134.

Turning to FIG. 8, contact 142 to pFET 114, e.g., diffusion region 156, is formed and contacts 140 to nFET 112 are extended through ILD 124, second silicon layer 122 (STI 128), compressive nitride liner 134, and ILD 162.

As such, IC 100 satisfactorily solves the problems of the current state of art technology as identified above, and can take the full advantages of STI stress, liner stress, and silicide stress to improve the performance of both nFETs and pFETs. In addition, because nFETs 112 and pFETs 114 are positioned on separated silicon layers 120, 122 that are positioned differently vertically (stacked) relative to one another, the area of the IC is also reduced.

The structures described above are used in integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. An integrated circuit (IC) comprising:
   two silicon layers separated by a dielectric layer, one of the two silicon layers located above the other one;
   an N-channel field effect transistor (nFET) formed on one of the two silicon layers, and a P-channel field effect transistor (pFET) formed on the other one of the two silicon layers; and
   a first shallow trench isolation (STI) adjacent to the nFET, and a second STI adjacent to the pFET, wherein the first STI and the second STI induce different stress in a channel region of the nFET and a channel region of the pFET, respectively.

2. The integrated circuit of claim 1, wherein the first STI induces tensile stress and the second STI induces compressive stress.

3. The integrated circuit of claim 1, further comprising a first liner layer on the nFET and a second liner layer on the pFET, wherein the first liner layer and the second liner induce different stress in the channel region of the nFET and the channel region of the pFET, respectively.

4. The integrated circuit of claim 3, wherein the first liner layer induces tensile stress and the second liner layer induces compressive stress.

5. The integrated circuit of claim 1, wherein a silicide of the nFET and a silicide of the pFET include different silicide stress.

6. The integrated circuit of claim 1, wherein the first and the second silicon layers are of different crystalline orientations.

7. The integrated circuit of claim 1, wherein a contact to a device on a lower one of the silicon layers extends through an upper one of the silicon layers and is insulated from silicon of the upper one of the silicon layers.

8. The integrated circuit of claim 7, wherein the contact extends through a STI on the upper one of the silicon layers.

9. An integrated circuit (IC) comprising:
   an N-channel field effect transistor (nFET) on a first silicon layer;
   a first shallow trench insulation (STI) adjacent to the nFET on the first silicon layer, the first STI inducing tensile stress on a channel region of the nFET;
   a P-channel FET (pFET) on a second silicon layer; and
   a second STI adjacent to the pFET on the second silicon layer, the second STI inducing compressive stress on a channel region of the pFET;
   wherein the first silicon layer and the second silicon layer are positioned differently vertically relative to one another.

10. The integrated circuit of claim 9, further comprising a tensile liner layer covering the nFET.

11. The integrated circuit of claim 9, further comprising a compressive liner layer covering the pFET.

12. The integrated circuit of claim 9, wherein a silicide of the nFET and a silicide of the pFET include different silicide stress.

* * * * *